US006863834B2

(12) United States Patent
Hiroki et al.

(10) Patent No.: US 6,863,834 B2
(45) Date of Patent: Mar. 8, 2005

(54) METHOD FOR MANUFACTURING LIQUID EJECTING HEAD

(75) Inventors: Tomoyuki Hiroki, Kanagawa (JP); Masahiko Ogawa, Tokyo (JP); Ichiro Saito, Kanagawa (JP); Yoshiyuki Imanaka, Kanagawa (JP); Muga Mochizuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 238 days.

(21) Appl. No.: 10/023,665

(22) Filed: Dec. 21, 2001

(65) Prior Publication Data

US 2002/0084245 A1 Jul. 4, 2002

(30) Foreign Application Priority Data

Dec. 22, 2000 (JP) ....................................... 2000-389712

(51) Int. Cl.[7] ........................ G01D 15/00; G11B 5/127; H01L 21/00

(52) U.S. Cl. ............................................ 216/27; 438/21

(58) Field of Search .......................... 216/27; 29/890.1; 347/20, 29, 40, 44, 47, 49, 65, 67, 69, 71, 54

(56) References Cited

U.S. PATENT DOCUMENTS

| | | | | |
|---|---|---|---|---|
| 4,601,777 A | * | 7/1986 | Hawkins et al. | 216/27 |
| 4,638,328 A | * | 1/1987 | Drake et al. | 347/75 |
| 5,278,585 A | | 1/1994 | Karz et al. | 346/140 R |
| 5,870,123 A | * | 2/1999 | Lorenze et al. | 347/65 |
| 5,902,492 A | * | 5/1999 | Suzuki et al. | 216/27 |
| 6,254,215 B1 | | 7/2001 | Hiroki et al. | 347/20 |
| 6,375,858 B1 | * | 4/2002 | Makigaki et al. | 216/27 |

FOREIGN PATENT DOCUMENTS

| | | | | |
|---|---|---|---|---|
| JP | 6-31918 | | 2/1994 | |
| JP | 06171089 A | * | 6/1994 | B41J/2/05 |

OTHER PUBLICATIONS

See U.S. Appl. No. 5,278,585 (counterpart).

* cited by examiner

*Primary Examiner*—Gregory Mills
*Assistant Examiner*—Roberts Culbert
(74) *Attorney, Agent, or Firm*—Fitzpatrick, Cella, Harper & Scinto

(57) ABSTRACT

A method for manufacturing a liquid ejecting head, in which liquid flow paths are defined by combining an element substrate with a nozzle member, comprises a step for preparing a material common to the element substrate as a base material of the nozzle member, a step for forming etching mask layers on first and second surfaces of the base material of the nozzle member, a step for forming a recessed portion in the second surface of the base material by patterning the mask layer on the second surface and effecting etching via the mask layer of the second surface, and a step for forming the nozzle grooves in the base material and communicating the recessed portion with the nozzle grooves by patterning the mask layer on the first surface of the base material and effecting etching via the mask layers of the first and second surfaces.

6 Claims, 9 Drawing Sheets

FIG. 6
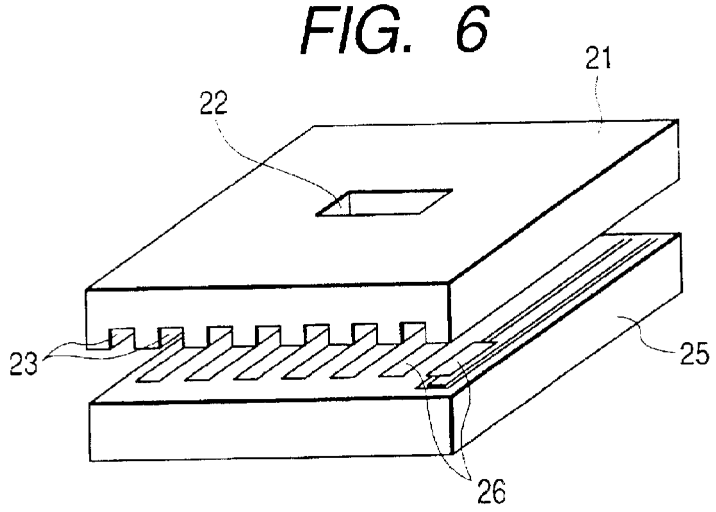
FIG. 7B
FIG. 7A
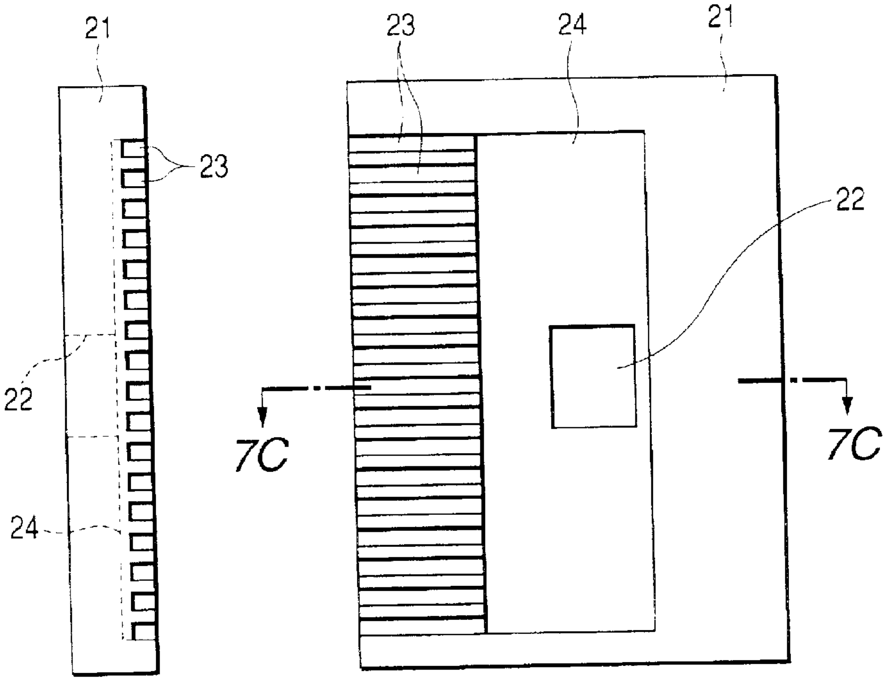
FIG. 7C
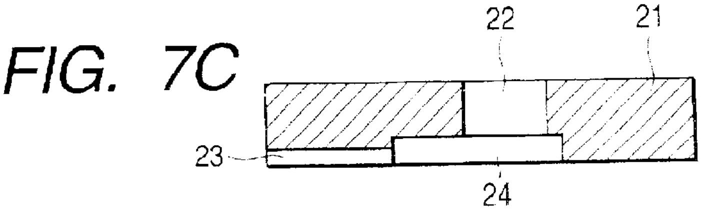

METHOD FOR MANUFACTURING LIQUID EJECTING HEAD

BACKGROUND OF THE INVENTION

1. Field of the Invention

The present invention relates to a method for manufacturing a liquid ejecting head used with a liquid ejecting system for ejecting liquid from a liquid discharge nozzle as a liquid droplet.

2. Related Background Art

A liquid ejecting head used with a liquid ejecting system (ink jet system) includes a plurality of liquid discharge nozzles for discharging liquid such as ink, liquid supply paths communicated with the respective liquid discharge nozzles, and discharge energy generating elements (for example, electrical/thermal converting elements) associated with the respective liquid discharge nozzles so that, by applying a drive signal corresponding to discharge information to the discharge energy generating element to afford discharge energy to liquid within the liquid discharge nozzle associated with the discharge energy generating element, the liquid is discharged from a minute discharge port of the liquid discharge nozzle as a flying liquid droplet, thereby effecting the recording.

As liquid discharge heads of this kind and nozzle members therefor, various techniques have been proposed, and various manufacturing method therefor have also been proposed. Now, an example of the conventional liquid discharge head and nozzle member therefor will be described with reference to FIGS. 11 and 12. FIG. 11 is a view showing a liquid discharge head and a nozzle member disclosed in Japanese Patent Application Laid-open No. 6-31918 (1994), for example, wherein a nozzle member 101 is formed from a silicon wafer cut and polished to have a surface having a crystal <100> face. The nozzle member includes a through opening 102 for supplying liquid and liquid discharge nozzles 103. A heater board (element substrate) 105 comprises silicon chips on which plural electrical/thermal converting elements (referred to as "heaters" hereinafter) 106 as discharge energy generating elements are provided. The nozzle member 101 and the heater board 105 are joined or adhered to each other so that the nozzles 103 are opposed to the heaters 106, and thin or fine nozzles each having a triangular cross-section are defined between the nozzle member 101 and the heater board 105, and the heaters 106 are included in the respective nozzles 103.

The nozzle member 101 is manufactured as follows. That is to say, an inorganic film made of $SiO_2$ is formed on the surface of the silicon wafer constituting the nozzle member 101 by a film forming method such as thermal oxidation or CVD, and a resist material of an organic film is formed on the nozzle surface by a spin-coat method. Then, patterning corresponding to shapes of the nozzles 103 and the through opening 102 is effected, and, thereafter, anisotropical wet etching is effected while immersing the nozzle member 101 into etching liquid such as KOH or TMAH. As a result, the etching grows along a <111> face of the silicon, and, when a silicon wafer having a surface of a <100> face is used, since the <111> face is inclined by 54.7 degrees with respect to the surface, the nozzles 103 and the through opening 102 are formed in shapes as shown in FIGS. 11 and 12.

When the liquid ejecting head is formed by joining or adhering the nozzle member 101 formed in this way to the heater board 105, since there remains a wall portion 110 between the nozzles 103 and the through opening 102 in the nozzle member 101, flow paths for liquid cannot be reserved. To reserve such flow paths, as shown in FIG. 12, f/low path walls 107 are formed on the heater board 105 by patterning polyimide material, thereby reserving liquid supply paths as shown by the arrow 108.

In the liquid ejecting head shown in FIGS. 11 and 12, liquid such as ink is supplied from a liquid tank (not shown) and is directed into the through opening 102 as a liquid supply path and reaches the nozzles 103 through the aforementioned liquid supply paths. The plurality of heaters 106 provided on the heater board 105 are controlled by a control circuit (not shown) so that the heaters 106 are selectively energized in response to recording information. A heater 106 energized in response to the recording information generates heat to heat the liquid within the corresponding nozzle 103, and the heated liquid is boiled when it exceeds a certain critical temperature, thereby forming a bubble. Due to an increase in volume caused by the formation of the bubble, a part of the liquid is forcibly pushed out from the nozzle 103 to fly onto a recording medium such as paper. By repeating such operations, a recorded image is completed.

In the above-mentioned conventional technique, by using the silicon wafer having a surface of a <100> face as the nozzle member, although there are provided advantages that the depth can be adjusted by the configuration of the patterning since the etching grows obliquely, and that the nozzles and the through opening can be formed by a single etching, as shown in FIG. 12, since the wall portion 110 remains between the nozzles 103 and the through opening 102, flow path walls 107 must be formed on the heater board 105 by patterning a polyimide material to reserve the liquid supply paths shown by the arrow 108 in FIG. 12, which makes the manufacturing processes of the heater board complicated.

Further, since the shape of each nozzle 103 has a triangular cross-section, as shown in FIG. 11, the wall thickness between adjacent nozzles 103 is increased, which worsens efficiency for forming the nozzles and works against a high density arrangement of nozzles.

Furthermore, in the liquid ejecting head in which heaters are used as the discharge energy generating elements, to solve a problem that the force of the bubble for discharging the liquid escapes through the through opening 102, as shown in FIG. 13, there has been proposed a method in which a valve 109 is provided above each heater 106 to enhance the liquid discharging efficiency. That is to say, the valve 109 serves to be moved upwardly by the bubble force when the bubble is generated by the heating of the heater 106 and to prevent the bubble from escaping toward the through opening 102. However, in the case there a nozzle 103 has a triangular cross-section, when the valve 109 is moved upwardly, the valve is apt to contact the walls of the nozzle 103, and, in order to prevent the valve 109 from contacting the walls of the nozzle, the nozzle width must be increased excessively, which works against a high density arrangement of nozzles.

Further, there have also been proposed methods for forming nozzles by working material other than silicon, and, according to such methods, although there is provided an advantage that the nozzles can be formed as free configurations by using resin and the like, when the number of nozzles is increased to lengthen the recording head, due to the difference in thermal expansion rates between the nozzle member and the heater board, good adhesion between the nozzle member and the heater board cannot be achieved, which leads to limitation of the length of the liquid ejecting head.

SUMMARY OF THE INVENTION

The present invention is made in consideration of the above-mentioned conventional drawbacks, and an object of the present invention is to provide a method for manufacturing a liquid ejecting head, whereby a liquid ejecting head suitable for high density arrangement of nozzles and suitable for lengthening the head can be manufactured, by forming a plurality of nozzles each having a rectangular cross-section, by effecting anisotropical etching on a member in which the liquid discharge nozzles are to be formed.

To achieve the above object, according to the present invention, there is provided a method for manufacturing a liquid ejecting head, in which liquid flow paths are defined by combining an element substrate having a plurality of discharge energy generating elements for applying discharge energy to liquid with a nozzle member having a plurality of liquid discharge nozzle grooves, which method comprises a step for preparing at least one material common to the element substrate as a base material of the nozzle member, a step for forming etching mask layers on a first surface of the base material of the nozzle member in which the nozzle grooves are formed and on a second surface opposite to the first surface, respectively, a step for forming a recessed portion in the second surface of the base material by patterning the mask layer on the second surface of the base material and by effecting etching via the mask layer of the second surface, and a step for forming the nozzle grooves in the base material and for communicating the recessed portion with the nozzle grooves by patterning the mask layer on the first surface of the base material and by effecting etching via the mask layer of the first surface and the mask layer of the second surface.

In the liquid ejecting head manufacturing method according to the present invention, it is preferable that a silicon wafer having a surface of a <110> face be used as the material of the nozzle member.

In the liquid ejecting head manufacturing method according to the present invention, it is preferable that an etching amount t of anisotropical etching for forming the recessed portion satisfies the relationship tw>t>tw−tn when it is assumed that the thickness of the nozzle member (silicon wafer) is tw and the depth of the nozzle groove is tn, and, in the manufacturing method in which the nozzle grooves and a liquid chamber are formed simultaneously by anisotropical etching, it is preferable that an etching amount t of anisotropical etching for forming the liquid supply paths satisfies the relationship tw>t>tw−2×tn when it is assumed that the thickness of the nozzle member (silicon wafer) is tw and the depth of the nozzle groove is tn.

According to the liquid ejecting head manufacturing method of the present invention, high density arrangement of nozzles is permitted, and an elongated liquid ejecting head can easily be manufactured.

Further, an elongated high density liquid ejecting head can stably be manufactured without requiring an increase in the alignment accuracy of patterning.

Furthermore, by forming the nozzle member by using the same silicon as the heater board, distortion due to heat does not occur between the nozzle member and the heater board, with the result good adhesion between the nozzle member and the heater board can be maintained and the liquid ejecting head can be made longer.

BRIEF DESCRIPTION OF THE DRAWINGS

FIG. 2A is a plan view of the nozzle member looked at from a nozzle forming surface side, FIG. 2B is a side view of the nozzle member, and FIG. 2C is a sectional view taken along the line 2C—2C in FIG. 2A;

FIG. 6 is a schematic perspective view of a liquid ejecting head manufactured in accordance with a second embodiment of a liquid ejecting head manufacturing method of the present invention;

FIGS. 7A, 7B and 7C are views showing a nozzle member constituting the liquid ejecting head manufactured in accordance with the second embodiment of the present invention, where FIG. 7A is a plan view of the nozzle member looked at from a nozzle forming surface side, FIG. 7B is a side view of the nozzle member, and FIG. 7C is a sectional view taken along the line 7C—7C in FIG. 7A;

DETAILED DESCRIPTION OF THE PREFERRED EMBODIMENTS

The present invention will now be explained in connection with embodiments thereof with reference to the accompanying drawings.

Figure 1:
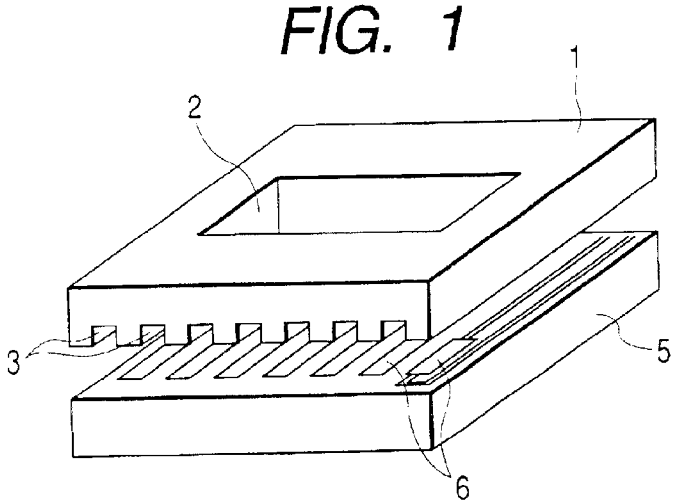
FIG. 1 is a schematic perspective view of a liquid ejecting head manufactured in accordance with a first embodiment of a liquid ejecting head manufacturing method of the present invention.
Figure 2B:
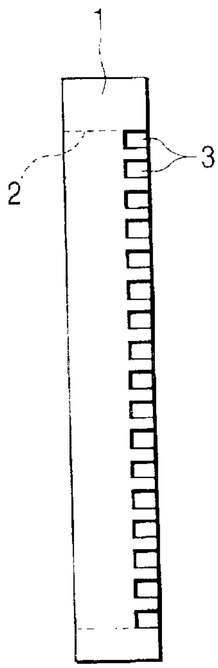
FIGS. 2A, 2B and 2C are views showing a nozzle member constituting the liquid ejecting head manufactured in accordance with the first embodiment of the present invention, where
Figure 2A:
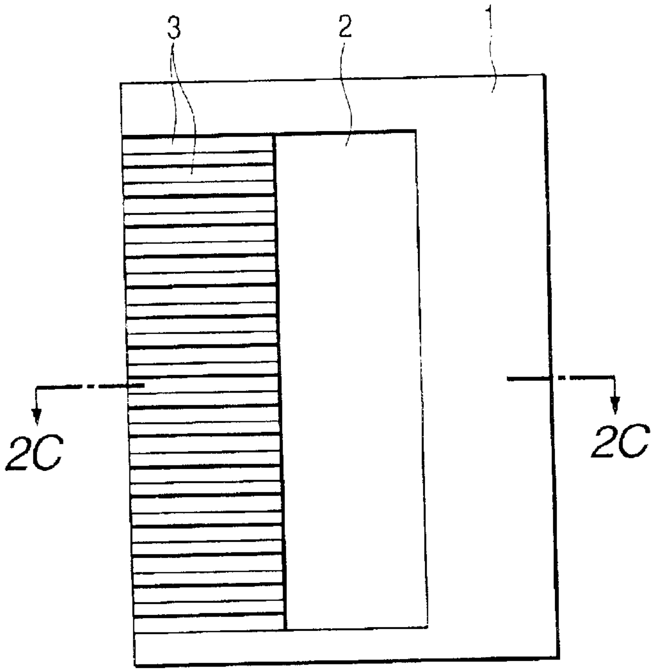
Figure 2C:
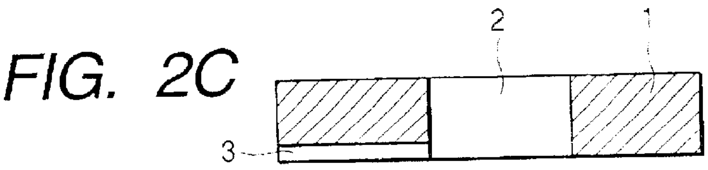

FIG. 1 is a schematic perspective view of a liquid ejecting head manufactured in accordance with a first embodiment of a liquid ejecting head manufacturing method of the present invention, and FIGS. 2A to 2C are views showing a nozzle member constituting the liquid ejecting head manufactured in accordance with the first embodiment of the present invention, where FIG. 2A is a plan view of the nozzle member looked at from a nozzle forming surface side, FIG. 2B is a side view of the nozzle member, and FIG. 2C is a sectional view taken along the line 2C—2C in FIG. 2A.

In FIG. 1 and FIGS. 2A to 2C, a nozzle member 1 is formed from a silicon wafer having a surface of a <110> face, and the nozzle member 1 is provided with a through opening 2 as a liquid supply path for supplying liquid, and a plurality of liquid discharge nozzles (or nozzle grooves) 3, and is joined or adhered to an element substrate (referred to as a "heater board" hereinafter) 5 on which a plurality of heaters 6 as discharge energy generating elements are provided.

The through opening 2 and the nozzles 3 are formed to have rectangular cross-sections by effecting anisotropical etching by using the silicon wafer having the surface of the <110> face as a material of the nozzle member 1. These rectangular cross-sections are different from the triangular or trapezoidal cross-sections of the conventional nozzles and through opening. By using the nozzle member 1 in which the nozzles 3 have rectangular cross-sections in this way, since the wall thickness between adjacent nozzles 3 can be reduced, a high density arrangement of nozzles 3 can easily be realized, and, since the nozzles 3 and the through opening 2 are interconnected within the nozzle member 1, it is not required that liquid supply paths be reserved by forming walls on the heater board 5. That is to say, unlike the conventional case, when the nozzle member 1 is closely joined to the heater board 5 having no special flow path members made of polyimide and liquid is supplied from a liquid tank (not shown) into the through opening 2, the nozzles 3 are filled with the liquid by a capillary phenomenon and, when the heater 6 on the heater board 5 is energized under the control of a control circuit (not shown), the liquid is bubbled and is discharged from a discharge port at an end of the nozzle 3.

Next, a method for manufacturing the nozzle member 1 will be fully described.

In general, it is known that, when silicon is subjected to wet etching by using etching liquid such as TMAH or KOH, an anisotropical etching phenomenon in which etching grows along a <111> crystal face occurs. If such wet etching is effected on a silicon wafer having a surface of a <100> face, since the <111> face is inclined by 54.7 degrees with respect to the <100> face, the shapes as described in connection with the conventional technique will be obtained. However, in the case of a silicon wafer having a surface of a <110> face, since the <111> face is then perpendicular to the surface, nozzles having vertical walls as shown in FIGS. 1 and 2A to 2C can be formed.

In this case, however, since the longer the etching time is the greater a depth of a groove (ultimately forming a through hole) is, the depth of the groove cannot be controlled by the mark configuration, unlike the conventional case. That is to say, the nozzles and the through opening cannot be formed by a single etching, and, thus, the patterning of the mask and the etching of the silicon must be effected two times. Although the depth of the nozzle is varied in dependence upon the density of the nozzles, since the nozzle depth is generally 10 $\mu$m to several hundreds of $\mu$m, for example, if the nozzles are formed first, although the nozzles must be protected by coating resist on the nozzles when the through opening is formed, it is difficult to coat the resist on the nozzles uniformly, whereby a problem regarding the protection of the nozzles arises. On the other hand, if the through opening is formed first, the patterning of the nozzle surface will become very difficult.

Now, manufacturing steps for the nozzle member according to a first embodiment will be explained with reference to FIGS. 3A to 3G.

Figure 3A:
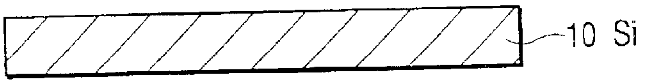
FIGS. 3A, 3B, 3C, 3D, 3E, 3F and 3G are views showing manufacturing steps for the nozzle member according to the first embodiment of the present invention.
Figure 3B:
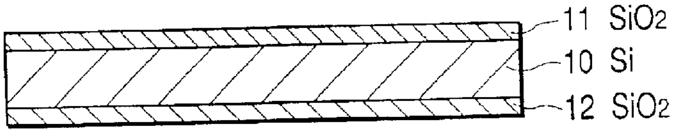
Figure 3C:
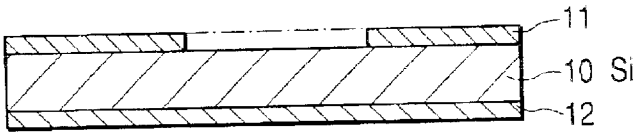
Figure 3D:
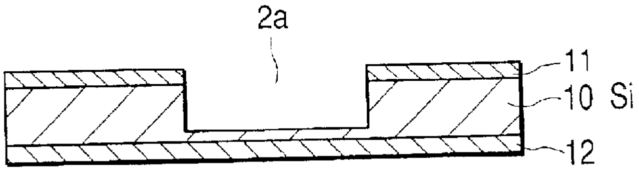

In FIG. 3A, a silicon (Si) wafer 10 constituting a material for the nozzle member has a surface of a <110> face. As shown in FIG. 3B, films 11, 12 of silicon dioxide ($SiO_2$) are formed on the respective surfaces of the silicon wafer 10 by a film forming method such as thermal oxidation or CVD. Incidentally, the silicon dioxide serves as a mask layer when the silicon is subjected to anisotropical etching. Then, as shown in FIG. 3C, patterning corresponding to the shape of the through opening is effected on the $SiO_2$ film 11 opposite to the nozzle forming surface by a normal photo-lithography technique. Then, anisotropical etching is effected while immersing the wafer in etching liquid such as TMAH. The etching grows from the patterning portion, thereby forming a deep hole 2*a*, as shown in FIG. 3D. In this case, it is important to prevent the hole from becoming a through hole by controlling the etching conditions. The reason for this is that if the hole 2*a* becomes a through hole and only the thin $SiO_2$ film 12 remains on the nozzle forming surface, it is impossible to keep the wafer surface at the nozzle forming surface side flat, with the result that it becomes difficult to effect resist coating and exposure in the subsequent nozzle formation. Thus, it is important that the silicon remains, to the extent of a small thickness, smaller than the depth of the nozzle. That is to say, the etching amount t of the anisotropical etching should satisfy the relationship $tw>t>tw-tn$ when it is assumed that the thickness of the silicon wafer (nozzle member) is tw and the depth of the nozzle 3 is tn.

Figure 3E:
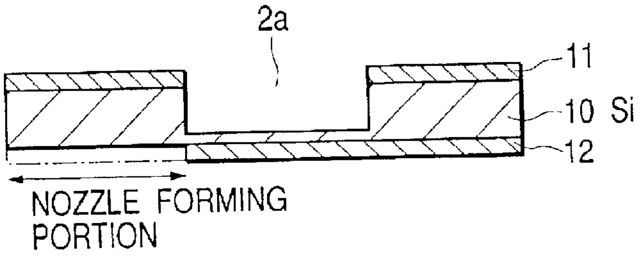
Figure 3F:
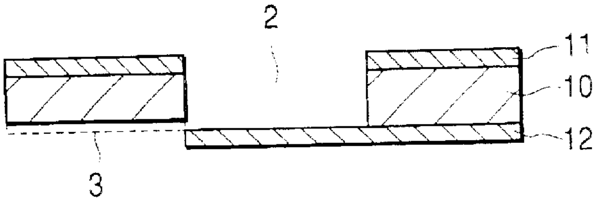
Figure 3G:
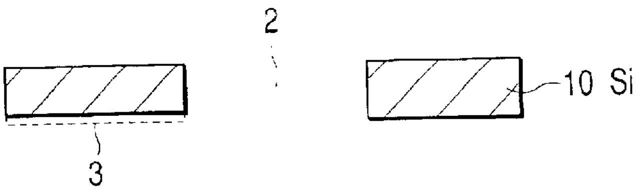
Figure 4A:
FIGS. 4A, 4B, 4C, 4D, 4E, 4F and 4G are views showing manufacturing steps for a nozzle member according to an alteration of the first embodiment of the present invention.
Figure 4B:
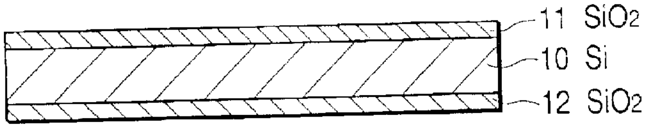
Figure 4C:
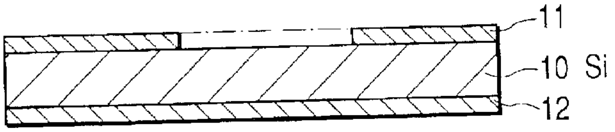
Figure 4D:
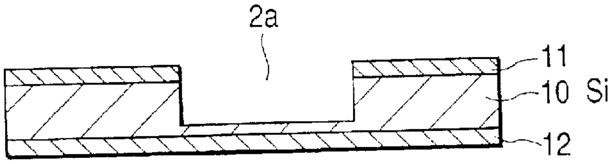
Figure 4E:
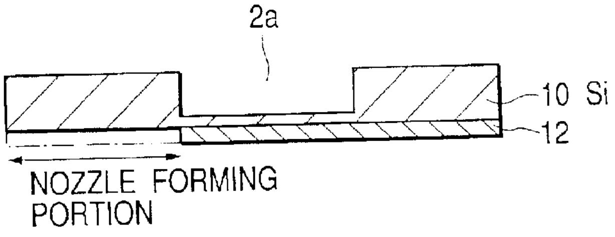
Figure 4F:
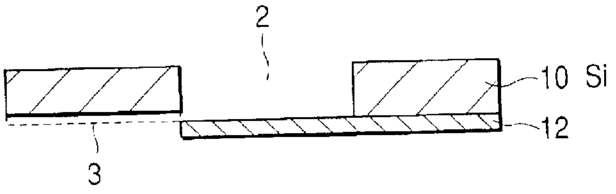
Figure 4G:
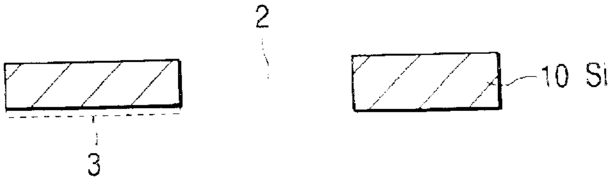

Then, resist material (not shown) is coated on the $SiO_2$ film 12 at the nozzle forming surface side, and patterning corresponding to the nozzle configuration is effected by dry etching (FIG. 3E). In this case, as mentioned above, since the nozzle forming surface side is kept flat, the coating of the resist material and the patterning corresponding to the nozzle configuration can be performed easily. Then, by immersing the silicon wafer in anisotropical etching liquid again, the nozzle portion is etched and, at the same time, etching for the holes 2*a* is continued from the opposite side. As a result, when the nozzle 3 is formed, the hole 2*a* reaches the nozzle forming surface to form the through opening 2 communicated with the nozzle 3 (FIG. 3F). Lastly, by removing the $SiO_2$ films 11, 12 remaining on both surfaces of the silicon wafer 10, a nozzle member having the nozzle 3 and the through opening 2, as shown in FIG. 3G, is completed.

Next, an alteration of the nozzle member manufacturing steps according to the illustrated embodiment will be explained with reference to FIGS. 4A to 4G. In this alteration, the steps shown in FIGS. 4A to 4D are the same as the aforementioned steps shown in FIGS. 3A to 3D. However, in the step shown in FIG. 3E, where dry etching was effected when the patterning of the $SiO_2$ film 12 was performed, this alteration differs from the illustrated embodiment in that, in the step shown in FIG. 4E, wet etching is effected. That is to say, while the $Sio_2$ film 11 remained on the surface opposite to the nozzle forming surface in the step shown in FIG. 3E, in the step shown in FIG. 4E, such a film 11 is removed. The reason is that, since the $SiO_2$ film 11 on the surface opposite to the nozzle forming surface is once subjected to the patterning for formation of the through opening and thus it is difficult to coat the resist thereon to protect the film, when the silicon wafer is immersed in the etching liquid in order to effect the patterning of the $SiO_2$ film 12 at the nozzle forming surface side, the $SiO_2$ film 11 on the surface opposite to the nozzle forming surface is etched simultaneously. Accordingly, in the anisotropical etching for formation of the nozzle (FIG. 4F), at the same time as the nozzle is formed, silicon on the opposite side is also etched. However, this opposite side does not relate to the discharge property directly, and, since it is important that the liquid from the liquid tank (not shown) be supplied without leakage, even when the nozzle member is totally thinned more or less, there is no problem regarding function. In this way, in this alteration, wet etching is effected as the patterning of silicon dioxide, thereby enhancing the productivity.

Further, in the first embodiment and the alteration thereof according to the present invention, since the same silicon as the heater board is used as the material of the nozzle member, even when the number of nozzles is increased to make the liquid ejecting head longer, the adhesion (close contact) between the nozzle member and the heater board is maintained and distortion due to heat does not occur.

Figure 5:
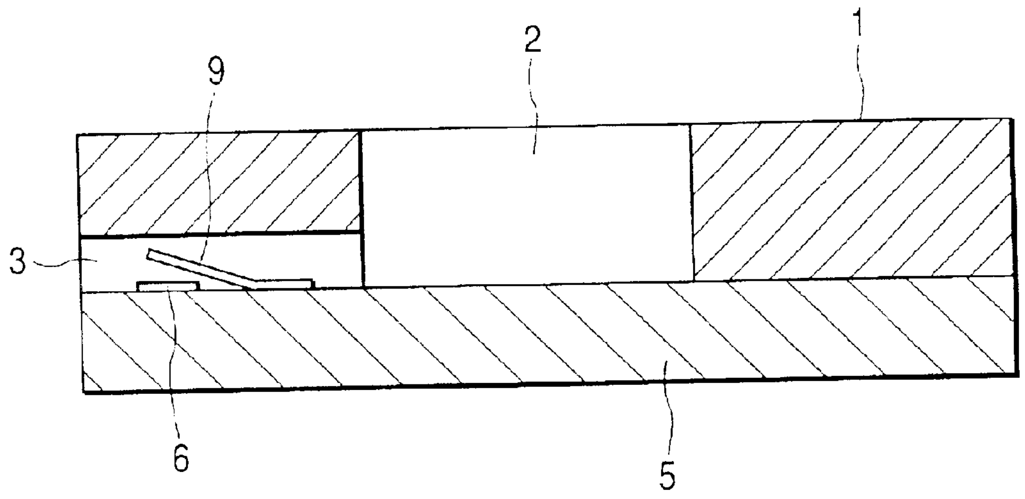
FIG. 5 is a sectional view of a liquid ejecting head in which a valve for improving discharge efficiency is added to the liquid ejecting head manufacturing in accordance with the first embodiment of the present invention.

Furthermore, the nozzle member in the first embodiment and the alteration thereof according to the present invention is also effective when a valve is provided in the nozzle to enhance the discharging efficiency. That is to say, as shown in FIG. 5, in a case where a valve 9 is provided above the heater 6, since the nozzle 3 has the rectangular cross-section, when the valve 9 is moved upwardly, the valve does not contact the walls of the nozzle 3. Thus, since the width of the nozzle 3 may be slightly greater than the width of the valve 9, a high density arrangement of nozzles can be achieved while maintaining high discharging efficiency.

Next, a second embodiment of a liquid ejecting head manufacturing method according to the present invention will be explained with reference to FIGS. 6 to 10. FIG. 6 is a schematic perspective view of a liquid ejecting head manufactured in accordance with a second embodiment of a liquid ejecting head manufacturing method of the present invention, and FIGS. 7A to 7C are views showing a nozzle member constituting the liquid ejecting head manufactured in accordance with the second embodiment of the present invention, where FIG. 7A is a plan view of the nozzle member looked at from a nozzle forming surface side, FIG. 7B is a side view of the nozzle member, and FIG. 7C is a sectional view taken along the line 7C—7C in FIG. 7A.

In FIG. 6 and FIGS. 7A to 7C, a nozzle member 21 is formed from a silicon wafer having a surface of a <110> face, and the nozzle member 21 is provided with a through opening 22 as a liquid supply path for supplying liquid, a plurality of liquid discharge nozzles (or nozzle grooves) 23 and a liquid chamber 24 (refer to FIG. 7A) for reserving the liquid to stably supply the liquid into the nozzles 23, and is joined or adhered to a heater board 25 on which a plurality of heaters 26 as discharge energy generating elements are provided.

The through opening 22, nozzles 23 and liquid chamber 24 are formed to have rectangular cross-sections by effecting anisotropical etching by using the silicon wafer having the surface of a <110> face as a material of the nozzle member 21. In general, it is known that, when silicon is subjected to wet etching by using etching liquid such as TMAH or KOH, etching grows along a <111> crystal face. Since the <111> face is perpendicular to the <110> face, nozzles having vertical walls, as shown in FIGS. 6 and 7A to 7C, can be formed. Further, by forming the liquid chamber 24 by anisotropical etching simultaneously with the nozzles 23, although the depth of the liquid chamber is substantially the same as depths of the nozzles 23, since the liquid chamber does not have walls such as those of the nozzles, the depth of the liquid chamber becomes slightly greater than the depths of the nozzles.

Next, manufacturing steps for the nozzle member according to the second embodiment will be explained with reference to FIGS. 8A to 8G.

Figure 8A:
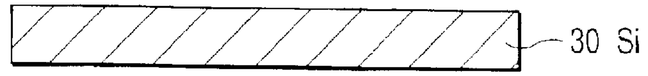
FIGS. 8A, 8B, 8C, 8D, 8E, 8F and 8G are views showing manufacturing steps for the nozzle member according to the second embodiment of the present invention.
Figure 8B:
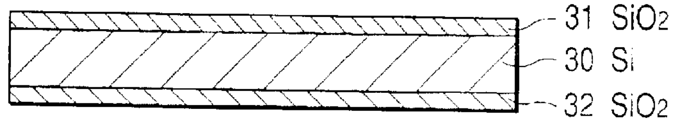
Figure 8C:
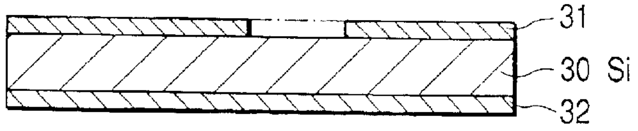
Figure 8D:
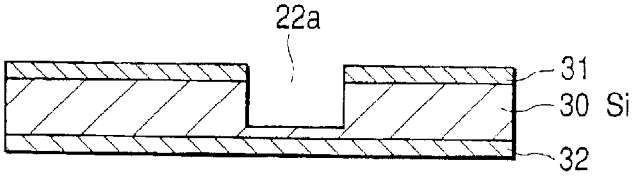

In FIG. 8A, a silicon (Si) wafer 30 constituting a material for the nozzle member has a surface of a <110> face. As shown in FIG. 8B, films 31, 32 of silicon dioxide ($SiO_2$) are formed on the respective surfaces of the silicon wafer 30 by a film forming method such as thermal oxidation or CVD. Then, as shown in FIG. 8C, patterning corresponding to the shape of the through opening is effected on the $SiO_2$ film 31 opposite to the nozzle forming surface by a normal photolithography technique. Then, anisotropical etching is effected while immersing the wafer in etching liquid such as TMAH. The etching grows from the patterning portion, thereby forming a deep hole 22_a_, as shown in FIG. 8D. In this case, it is important to prevent the hole from becoming a through hole by controlling the etching conditions. The reason for this is that if the hole 22_a_ becomes a through hole and only the thin $SiO_2$ film 32 remains on the nozzle forming surface, it is impossible to keep the wafer surface at the nozzle forming surface side flat, with the result that it becomes difficult to effect resist coating and exposure in the subsequent nozzle formation. Thus, a silicon layer remains by such an amount that the wafer surface at the nozzle forming surface side can be kept flat. That is, a silicon layer having a thickness less than twice the depth of the nozzle remains, as will be described later.

Figure 8E:
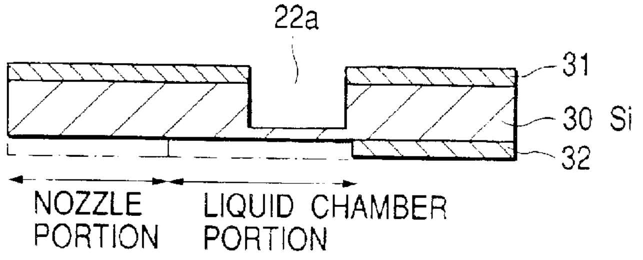
Figure 8F:
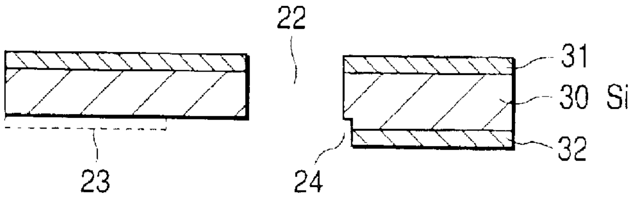

Then, a resist material (not shown) is coated on the $SiO_2$ film 32 at the nozzle forming surface side, and patterning corresponding to configurations of the nozzle 23 and the liquid chamber 24 is effected by dry etching (FIG. 8E). In this case, since the nozzle forming surface side is kept flat, the coating of the resist material and the patterning corresponding to the configurations of the nozzle and the liquid chamber can be performed easily. Then, by immersing the silicon wafer in anisotropical etching liquid again, the nozzle and liquid chamber portions are etched and, at the same time, etching for the holes 22_a_ is continued from the opposite side. As a result, when the nozzle 23 is formed, the hole 22_a_ reaches the nozzle forming surface to form a through opening 22 communicated with the nozzle 23 through the liquid chamber 24 (FIG. 8F). In this case, since the liquid chamber portion does not have a wall such as the wall of the nozzle, the etching speed of the liquid chamber becomes greater than that of the nozzle, and, thus, the depth of the liquid chamber becomes slightly greater than the depth of the nozzle. Here, regarding a relative position of the through opening 22 with respect to the liquid chamber 24, since it is important that the liquid chamber 24 is merely communicated with the through opening 22, so long as the through opening 22 is sufficiently smaller than the dimensions of the liquid chamber 24, the alignment accuracy is not required to be severe. By forming the nozzle 23 and the liquid chamber 24 simultaneously, the length of the nozzle can be reserved and the through opening 22 can surely be communicated with the liquid chamber 24. Further, at an area where the through opening 22 is communicated with the liquid chamber 24, since the etching grows from both sides, the thickness of the silicon that is to remain (so as to prevent the hole 22_a_ from becoming a through opening) in the anisotropical etching step shown in FIG. 8D can be made less than twice the depth of the nozzle. That is to say, the etching amount t of the anisotropical etching may have a value satisfying the relationship $tw>t>tw-2\times tn$ when it is assumed that the thickness of the silicon wafer (nozzle member) 30 is tw and the depth of the nozzle 23 is tn.

In this way, in the second embodiment, a problem that the nozzles may not be communicated with the through opening due to mis-alignment caused when the patterning is effected on both surfaces of the silicon wafer to form the nozzles 23 and the through opening 22 respectively, and a problem that the lengths of the nozzles are reduced due to excessive overlap, can be eliminated.

Figure 8G:
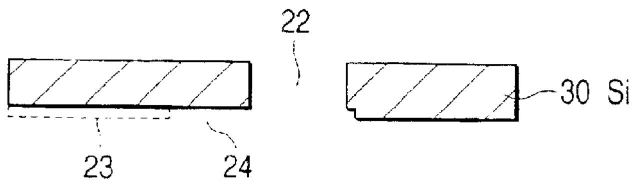
Figure 9A:
FIGS. 9A, 9B, 9C, 9D, 9E, 9F and 9G are views showing manufacturing steps for a nozzle member according to an alteration of the second embodiment of the present invention.
Figure 9B:
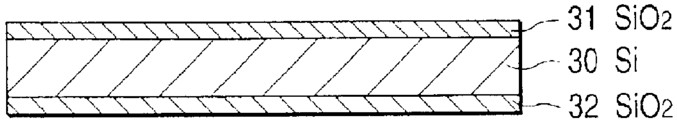
Figure 9C:
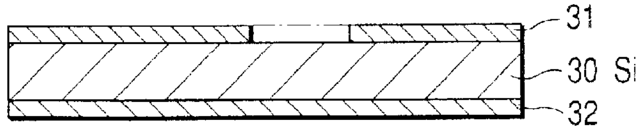
Figure 9D:
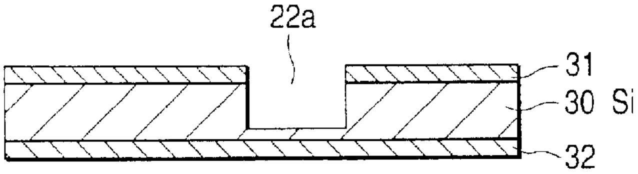
Figure 9E:
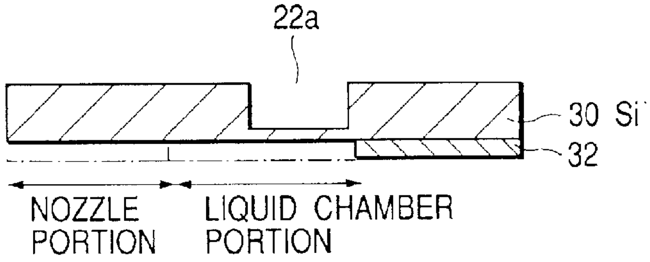
Figure 9F:
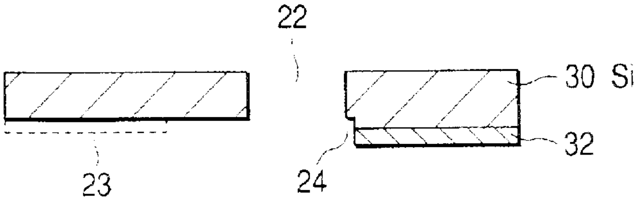
Figure 9G:
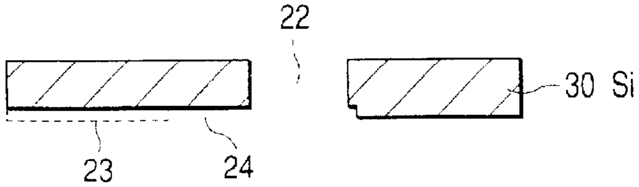

After the nozzles 23, liquid chamber 24 and through opening 22 were formed in this way, by removing the $SiO_2$ films 31, 32 remaining on the respective surfaces of the silicon wafer 30, the nozzle member as shown in FIG. 8G is completed.

By using the nozzle member manufactured in accordance with the second embodiment, since the wall thickness between adjacent nozzles can be reduced, a high density arrangement of nozzles can easily be realized, and, since the nozzles and the through opening are interconnected within the nozzle member, it is not required that liquid supply paths be reserved by forming walls on the heater board. That is to say, as shown in FIG. 6, when the nozzle member 21 is closely joined to the heater board 25 having no special flow path members made of polyimide and liquid is supplied from a liquid tank (not shown) into the through opening 22, the nozzles 23 are filled with the liquid through the liquid chamber 24 by a capillary phenomenon. Further, since the correct nozzle length can be reserved without requiring an increase in the alignment accuracy of the patterning on both surfaces, stable liquid discharging can always be performed. Incidentally, although the rectangular grooves can be formed by dry etching in the nozzle forming step shown in FIG. 8F, wet etching is preferable in consideration of productivity.

Next, an alteration of the nozzle member manufacturing steps according to the illustrated embodiment will be explained with reference to FIGS. 9A to 9G. In this alteration, the steps shown in FIGS. 9A to 9D are the same as the aforementioned steps shown in FIGS. 8A to 8D. However, in the step shown in FIG. 8E, where dry etching was effected when the patterning of the $SiO_2$ film 32 was performed, this alteration differs from the illustrated embodiment in that, in the step shown in FIG. 9E, wet etching is effected. That is to say, while the $SiO_2$ film 31 remained on the surface opposite to the nozzle forming surface in the step shown in FIG. 8E, in the step shown in FIG. 9E, such a film 31 is removed. The reason is that, since the $SiO_2$ film 31 on the surface opposite to the nozzle forming surface is once subjected to the patterning for formation of the through opening and thus it is difficult to coat the resist thereon to protect the film, when the silicon wafer is immersed in the etching liquid in order to effect the patterning of the $SiO_2$ film 32 at the nozzle forming surface side, the $SiO_2$ film 31 on the surface opposite to the nozzle forming surface is etched simultaneously. Accordingly, in the anisotropical etching for the formation of the nozzle (FIG. 9F), at the same time as the nozzle is formed, the silicon at the opposite side is also etched. However, this opposite side does not relate to the discharge property directly, and, since it is important that the liquid from the liquid tank (not shown) be supplied without leakage, even when the nozzle member is totally thinned more or less, there is no problem regarding function. In this way, in this alteration, wet etching is effected as the patterning of the silicon dioxide, thereby further enhancing the productivity.

Figure 10:
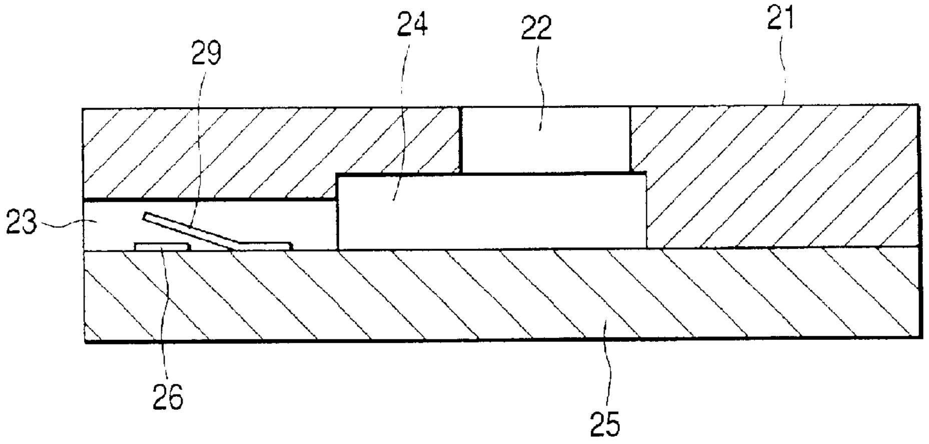
FIG. 10 is a sectional view of a liquid ejecting head in which a valve for improving discharge efficiency is added to the liquid ejecting head manufactured in accordance with the second embodiment of the present invention.
Figure 11:
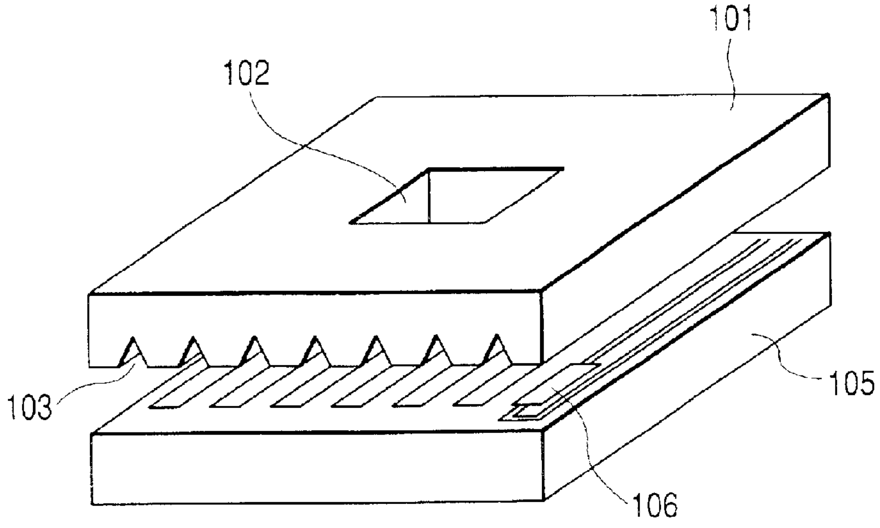
FIG. 11 is a schematic perspective view of a conventional liquid ejecting head.
Figure 12:
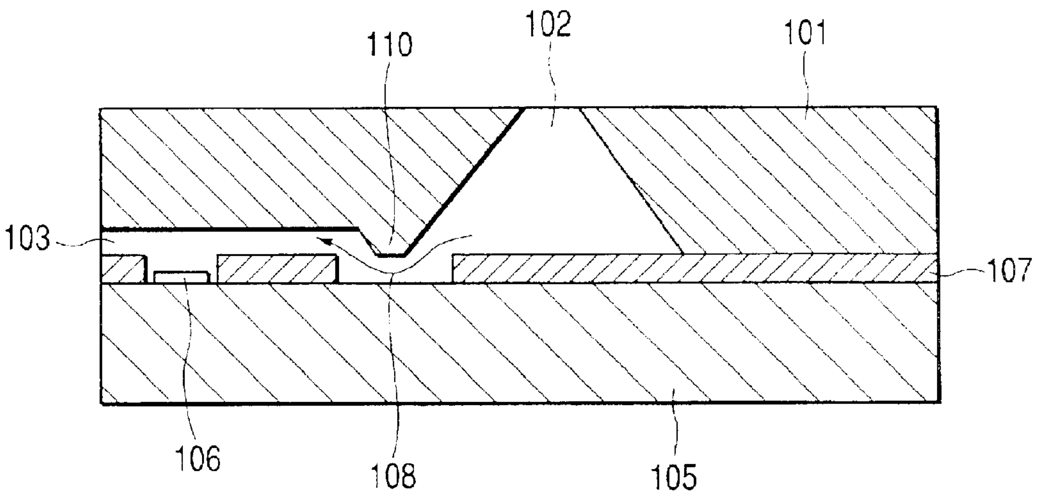
FIG. 12 is a schematic sectional view of the liquid ejecting head shown in FIG. 11.
Figure 13:
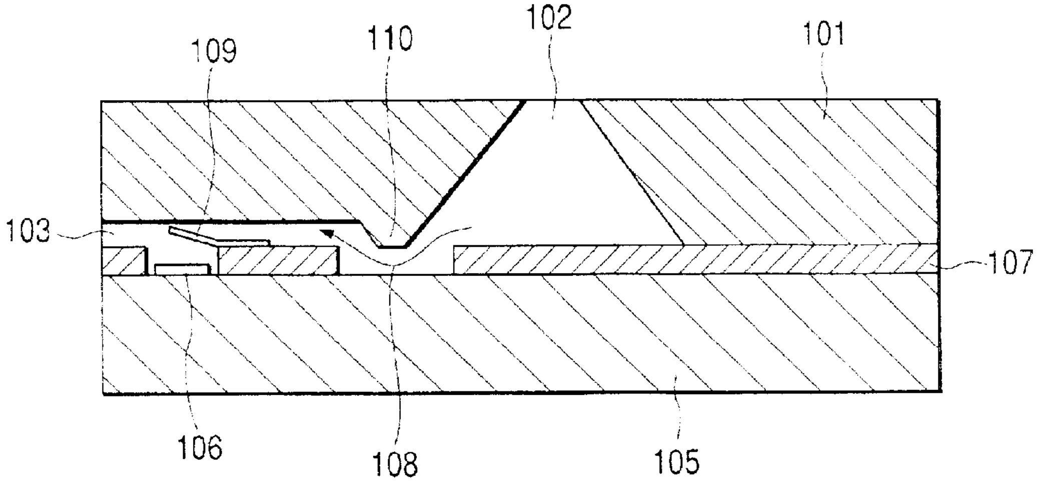
FIG. 13 is a schematic sectional view of a liquid ejecting head in which a valve for improving discharge efficiency is added to the liquid ejecting head shown in FIG. 11.

As mentioned above, also in the second embodiment and the alteration thereof according to the present invention, a high density arrangement of nozzles can be realized, and, since the same silicon as the heater board is used as the material of the nozzle member, even when the number of nozzles is increased to make the liquid ejecting head longer, the adhesion (close contact) between the nozzle member and the heater board is maintained and distortion due to heat does not occur. Further, the nozzle member in the second embodiment and the alteration thereof according to the present invention is also effective when a valve is provided in the nozzle to enhance the discharging efficiency. That is to say, as shown in FIG. 10, in a case where a valve 29 is provided above the heater 26, since the nozzle 23 has a rectangular cross-section, when the valve 29 is moved upwardly, the valve does not contact the walls of the nozzle 23. Thus, since the width of the nozzle 23 may be slightly greater than the width of the valve 29, a high density arrangement of nozzles can be achieved while maintaining high discharging efficiency.

As mentioned above, according to the present invention, since vertical nozzle walls can be formed by using silicon as the material of the nozzle member of the liquid ejecting head, an elongated liquid ejecting head having a high density arrangement of nozzles can easily be manufactured.

Further, by manufacturing the nozzle member by using the same silicon material as the heater board, distortion due to heat between the nozzle member and the heater board can be prevented, with the result that close contact between the nozzle member and the heater board can be maintained, thereby providing an elongated liquid ejecting head.

What is claimed is:

1. A method for manufacturing a liquid ejecting head, in which liquid flow paths are defined by combining an element substrate having a plurality of discharge energy generating elements for applying discharge energy to liquid with a nozzle member having a plurality of liquid discharge nozzle grooves and an opening communicating with said nozzle grooves, comprising the steps of:

preparing at least one material common to said element substrate having a first surface of <110> crystal face orientation as a base material of said nozzle member;

forming etching mask layers on said first surface of the base material of said nozzle member for forming said nozzle grooves and on a second surface opposite to said first surface, respectively;

before patterning said mask layer on said first surface of the base material, forming a recessed portion corresponding to said opening in said second surface of the base material by patterning said mask layer on said second surface of the base material and by effecting etching in said second surface via said mask layer of said second surface; and after forming said recessed portion, forming said nozzle grooves and said opening in the base material for communicating said recessed portion with said nozzle grooves, by patterning said mask layer on said first surface of the base material and by effecting etching in said first surface and said recessed portion via said mask layer of said first surface and said mask layer of said second surface.

2. A method according to claim 1, wherein an etching amount t of etching for forming said recessed portion satisfies a relationship $tw>t>tw-tn$ when it is assumed that a thickness of said nozzle member is tw and a depth of said nozzle groove is tn.

3. A method according to claim 1, wherein at least one of said mask layers is constituted by a silicon dioxide film.

4. A method for manufacturing a liquid ejecting head, in which liquid flow paths are defined by combining an element substrate having a plurality of discharge energy generating elements for applying discharge energy to liquid with a nozzle member having a plurality of liquid discharge nozzle grooves and a liquid chamber communicating with said nozzle grooves and an opening communicating with said liquid chamber, comprising the steps of:

preparing at least one material common to said element substrate having a first surface of <110> crystal face orientation as a base material of said nozzle member;

forming etching mask layers on said first surface of the base material of said nozzle member for forming said nozzle grooves and said liquid chamber and on a second surface opposite to said first surface, respectively;

before patterning said mask layer on said first surface of the base material, forming a recessed portion corresponding to said opening in said second surface of the base material by patterning said mask layer on said second surface of the base material and by effecting etching in said second surface via said mask layer of said second surface; and after forming said recessed portion, forming said nozzle grooves, said liquid chamber, and said opening in the base material for communicating said recessed portion with said liquid chamber, by patterning said mask layer on said first surface of the base material and by effecting etching in said first surface and said recessed portion via said mask layer of said first surface and said mask layer of said second surface.

5. A method according to claim 4, wherein an etching amount t of etching for forming said recessed portion satisfies a relationship $tw>t>tw-2\times tn$ when it is assumed that a thickness of said nozzle member is tw and a depth of said nozzle groove is tn.

6. A method according to claim 4, wherein at least one of said mask layers is constituted by a silicon dioxide film.

* * * * *

UNITED STATES PATENT AND TRADEMARK OFFICE
CERTIFICATE OF CORRECTION

PATENT NO. : 6,863,834 B2 
DATED : March 8, 2005
INVENTOR(S) : Tomoyuki Hiroki et al.

It is certified that error appears in the above-identified patent and that said Letters Patent is hereby corrected as shown below:

Title page,
Item [56], References Cited, FOREIGN PATENT DOCUMENTS,
"JP 06171089 A" should read -- JP 6-171089 A --.

Column 1,
Line 28, "method" should read -- methods --.

Column 2,
Line 3, "f/low" should read -- flow --.
Line 50, "there" should read -- where --.

Column 3,
Line 45, "satisfies" should read -- satisfy --.
Line 59, "result" should read -- result that --.

Column 5,
Line 52, "in dependence" should read -- depending --.

Column 6,
Line 52, "$Sio_2$" should read -- $SiO_2$ --.

Column 8,
Line 46, "is" (second occurrence) should read -- be --.

Signed and Sealed this

Seventh Day of February, 2006

JON W. DUDAS
*Director of the United States Patent and Trademark Office*